(12) United States Patent
Riepling et al.

(10) Patent No.: US 12,077,110 B2
(45) Date of Patent: Sep. 3, 2024

(54) CONSOLIDATED ELECTRONICS PACKAGING

(71) Applicant: Apple Inc., Cupertino, CA (US)

(72) Inventors: Jeffrey M. Riepling, Clayton, CA (US); Ryan J. Garrone, San Francisco, CA (US); Philipp J. Wolf, Capistrano Beach, CA (US)

(73) Assignee: APPLE INC., Cupertino, CA (US)

( * ) Notice: Subject to any disclaimer, the term of this patent is extended or adjusted under 35 U.S.C. 154(b) by 231 days.

(21) Appl. No.: 17/733,462

(22) Filed: Apr. 29, 2022

(65) Prior Publication Data

US 2022/0410826 A1 Dec. 29, 2022

Related U.S. Application Data

(60) Provisional application No. 63/216,056, filed on Jun. 29, 2021.

(51) Int. Cl.
| | | |
|---|---|---|
| *H05K 7/00* | (2006.01) | |
| *B60R 16/023* | (2006.01) | |
| *H05K 5/00* | (2006.01) | |
| *H05K 5/03* | (2006.01) | |
| *H05K 7/20* | (2006.01) | |

(52) U.S. Cl.
CPC ....... *B60R 16/0239* (2013.01); *H05K 5/0065* (2013.01); *H05K 5/03* (2013.01); *H05K 7/20854* (2013.01)

(58) Field of Classification Search
CPC .... B60R 16/0239; H05K 5/0065; H05K 5/03; H05K 7/20854
See application file for complete search history.

(56) References Cited

U.S. PATENT DOCUMENTS

| | | | |
|---|---|---|---|
| 2012/0037415 A1 | 2/2012 | Demma | |
| 2015/0137589 A1* | 5/2015 | Iyatani | B60R 16/0239 |
| | | | 701/1 |
| 2017/0120848 A1 | 5/2017 | Duran Hernandez et al. | |

(Continued)

FOREIGN PATENT DOCUMENTS

| | | |
|---|---|---|
| CN | 107785513 A | 3/2018 |
| CN | 111165081 A | 5/2020 |

(Continued)

OTHER PUBLICATIONS

Roland Berger, "Consolidation in Vehicle Electronic Architectures", Strategy Consultants, Think Act, Jul. 2015, https://www.google.com/search?q=roland_berger_tab_consolidation_in_vehicle_electronic_architectures_20150721.pdf, (20 pp).

(Continued)

*Primary Examiner* — Pete T Lee
(74) *Attorney, Agent, or Firm* — Young Basile Hanlon & MacFarlane, P.C.

(57) ABSTRACT

A housing for a consolidated electronics unit of a vehicle includes side walls mountable to vehicle rails of the vehicle, a bottom wall coupled to the side walls, and a cover removably coupleable to the side walls and configured to form a portion of an interior surface of a vehicle cabin of the vehicle. The cover, the side walls, and the bottom wall form a cavity configured to enclose control units that are in electronic communication with feature units disposed throughout the vehicle.

20 Claims, 5 Drawing Sheets

(56) References Cited

U.S. PATENT DOCUMENTS

| | | | | |
|---|---|---|---|---|
| 2017/0217388 A1* | 8/2017 | Ghannam | ............ | H05K 5/061 |
| 2019/0150328 A1* | 5/2019 | Miura | .................... | B60R 16/03 |
| | | | | 361/699 |
| 2020/0148136 A1 | 5/2020 | Takei | | |

FOREIGN PATENT DOCUMENTS

| | | | | | |
|---|---|---|---|---|---|
| DE | 102009043100 A1 | | 3/2011 | | |
| EP | 0448783 A1 | | 10/1991 | | |
| EP | 0825067 A2 | | 2/1998 | | |
| EP | 3650280 A1 | * | 5/2020 | ............. | B60H 1/246 |
| WO | 86/06334 A1 | | 11/1986 | | |
| WO | WO-9857825 A1 | * | 12/1998 | ............. | B60K 35/00 |

OTHER PUBLICATIONS

Venture Outsource, "Vehicle electronic control unit (ECU) consolidation targets the self-driving autonomous car", Online Seminars & Labs, Electronic EMS Manufacturing Training & Certification from Venture Outsource, https://www.ventureoutsource.com/contract-manufacturing/vehicle-electronic-control-unit-consolidation-targets-the-self-driving-autonomous-car, Date Unknown, Downloaded Apr. 27, 2022 (3 pp).

International Search Report and Written Opinion issued on Aug. 19, 2022 in Intl. App. No. PCT/US2022/027029 (16 pp).

* cited by examiner

CONSOLIDATED ELECTRONICS PACKAGING

CROSS-REFERENCE TO RELATED APPLICATION(S)

This application claims the benefit of U.S. Provisional Patent Application No. 63/216,056, filed on Jun. 29, 2021, the content of which is hereby incorporated by reference in their entirety for all purposes.

TECHNICAL FIELD

This disclosure relates generally to electronics packaging and specifically to packaging of control components in a vehicle electronics architecture.

BACKGROUND

Packaging of electronic systems in a vehicle is often executed sequentially as new features are added to the vehicle. The amount of weight added to the vehicle with a given feature is dictated by existing body structures, current wire harness configurations, and mounting space available within the vehicle. This feature-by-feature approach can lead to a large number of control units spread throughout vehicle and mounted in a variety of locations. Adding new features can be implemented, for example, by use of pigtail or splice into existing wire harnesses or addition of new wiring harnesses or cables. Thus, new electronic systems often increase the number of control units, fasteners, brackets, wiring harnesses, cables connectors, etc. in the vehicle, which in turn increases weight and build complexity.

SUMMARY

One aspect of the disclosed embodiments is a consolidated electronics unit for a vehicle. The consolidated electronics unit includes a housing defining a cavity and control units disposed within the cavity. The control units are configured for electronic communication with feature units disposed throughout the vehicle. The consolidated electronics unit includes a cover configured to removably couple to the housing, enclose the control units within the cavity, and form a portion of an interior surface of a vehicle cabin of the vehicle.

Another aspect of the disclosed embodiments is a housing for a consolidated electronics unit of a vehicle. The housing includes side walls disposed between seat rails. The seat rails are configured to support a seat in a vehicle cabin of the vehicle. The housing includes a bottom wall coupled to the side walls and mountable to a thermally-conditioned subsystem of the vehicle and a cover removably coupleable to the side walls. The cover, the side walls, and the bottom wall form a cavity configured to enclose control units. The control units are configured for electronic communication with feature units disposed throughout the vehicle. The cover forms a portion of a floor of a vehicle cabin of the vehicle.

Another aspect of the disclosed embodiments is a housing for a consolidated electronics unit of a vehicle. The housing includes side walls mountable to vehicle rails of the vehicle, a bottom wall coupled to the side walls, and a cover removably coupleable to the side walls and configured to form a portion of an interior surface of a vehicle cabin of the vehicle. The cover, the side walls, and the bottom wall form a cavity configured to enclose control units in electronic communication with feature units disposed throughout the vehicle.

DETAILED DESCRIPTION

Consolidation in packaging location of control units for various electronic systems implemented within a vehicle can support a shared voltage architecture, a shared mounting strategy, a common thermal conditioning system, and easy access for testing and replacement of control units that will simplify installation of electronics in a vehicle. In addition, wiring complexity and overall weight of a vehicle can be reduced while feature upgrade is streamlined.

Figure 1:
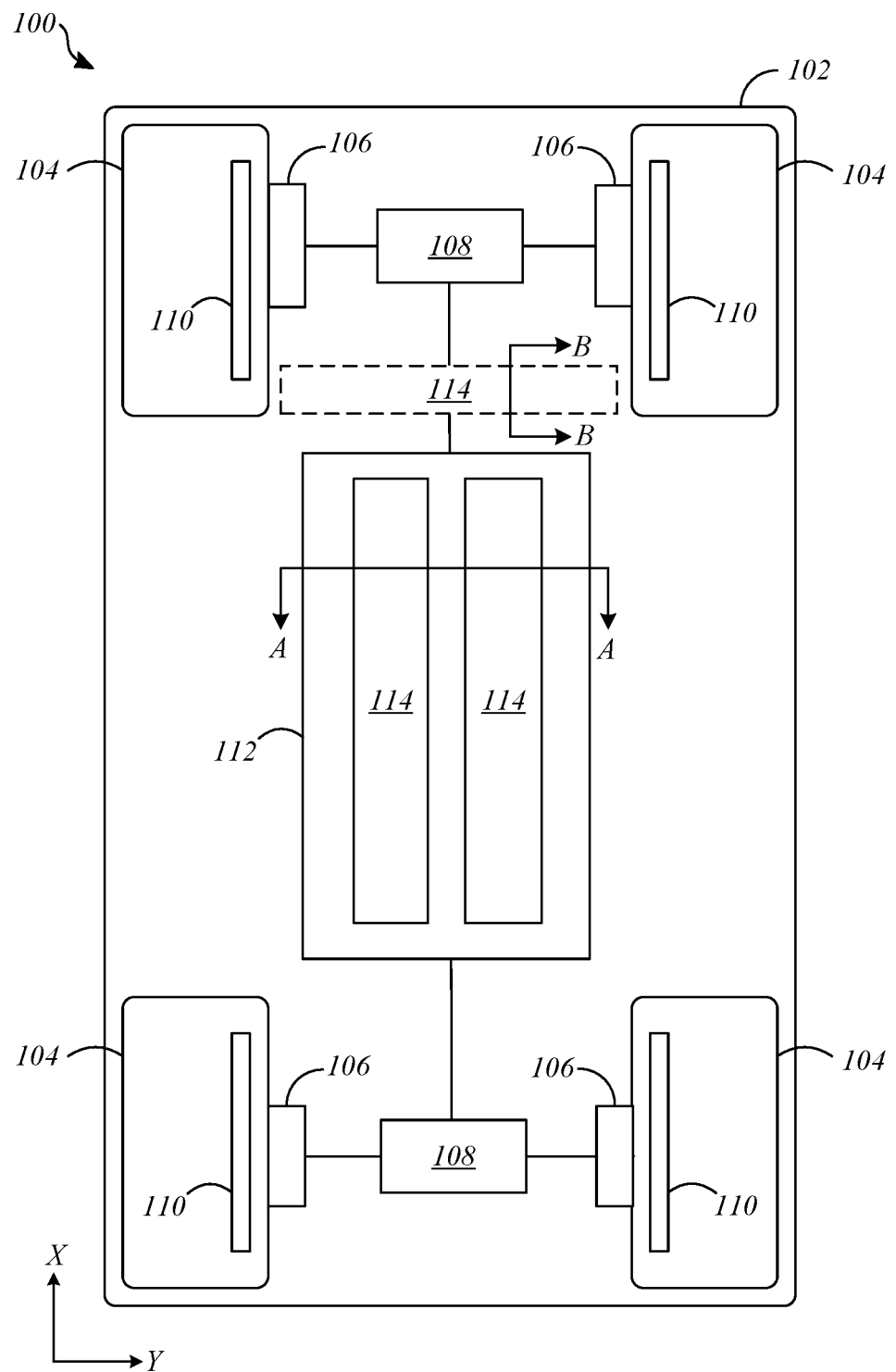
FIG. 1 is a schematic top view illustration of a portion of a vehicle.

FIG. 1 is a schematic top view illustration of a portion of a vehicle 100 with a body structure 102 showing the fore-aft or X direction and the lateral or Y direction. The body structure 102 may include internal structural portions and external portions that are aesthetic and/or structural in nature. As examples, the body structure 102 may include one or more of a unibody, a frame, a subframe, a monocoque, a floor, reinforcement rails, body panels, or other structural components.

The vehicle 100 includes wheels 104. Four of the wheels 104 are included in the illustrated example, but other implementations are possible. The wheels 104 contact the surface on which the vehicle 100 is travelling, and the characteristics of the wheels 104 are responsible, in part, for the amount of friction available. The wheels 104 may include tires, such as conventional pneumatic tires formed in part from synthetic rubber, or may include other friction-enhancing, adjustable structures. The wheels 104 may include sensors (not shown) that output signals indicative of the operating characteristics of some or all of the wheels 104. The wheels 104 may also include actuators (not shown) that are able to cause modification of operating characteristics of the wheels 104 in response to control signals.

The vehicle 100 includes suspension components 106. The suspension components 106 typically include numerous individual components, many of which are associated with one or more of the wheels 104. The suspension components 106 may include components that are operable to control characteristics of the motion of the wheels 104 relative to the body structure 102, such as shocks, struts, springs, dampers, and sway bars. The suspension components 106 may include either or both of non-adjustable passive components or adjustable active components that allow modification of suspension characteristics during operation of the vehicle 100. The suspension components 106 may include sensors that output signals indicative of the operating characteristics of some or all of the suspension components 106 at a given time. The suspension components 106 may also include actuators that are able to cause modification of operating characteristics of the suspension components 106 in response to control signals.

The vehicle 100 includes steering components 108. The steering components 108 are operable to modify a steering angle of some or all of the wheels 104 relative to the body structure 102. As one example, the steering components 108 may be or include a conventional rack and pinion arrangement. In some examples, the steering components 108 are operable to control the steering angles of the wheels 104 independently. The steering components 108 may include one or more sensors to output signals indicative of the steering angles of the wheels 104. The steering components 108 may include actuators operable to cause adjustment of the steering angles of the wheels 104 in response to control signals.

The vehicle 100 includes braking components 110. The braking components 110 include components that are operable to slow the speeds of the wheels 104, such as conventional disk brakes. Other types of components may be utilized to slow the speeds of the wheels 104. The braking components 110 also include components that cause and control application of braking forces. These components may include, as examples, a brake control module, a master cylinder, and a brake booster. The braking components 110 may be operable to apply braking to each of the wheels 104 individually. The braking components 110 may include sensors that output signals that are indicative of the current operating characteristics of the braking components 110. The braking components 110 may also include actuators that are operable to cause and control application of braking forces in response to control signals.

The vehicle 100 includes propulsion components 112. The propulsion components 112 may be referred to as a powertrain. The propulsion components 112 include a prime mover that is operable to convert stored energy into driving force and components that are operable to supply this force to some or all of the wheels 104 in order to propel the vehicle 100. As one example, the propulsion components 112 may include an internal combustion engine that burns liquid fuel. As another example, the propulsion components 112 may include an electric motor that utilizes electrical energy that is stored in a battery or batteries or supplied by a generator. The battery or batteries may include lithium-ion, nickel-metal hydride, lead-acid, ultracapacitor, or other technologies. The propulsion components 112 shown in FIG. 1 are located centrally within the vehicle 100, such as between the wheels 104.

The vehicle 100 includes a consolidated electronics unit (CEU) 114. The CEU 114 may be in electrical communication with components including the suspension components 106, the steering components 108, the braking components 110, the propulsion components 112, the sensors associated with these components, the actuators associated with these components, and other components (not shown) within the vehicle 100, such as climate control components, communication components, entertainment components, lighting components, safety components, etc., in order to transmit commands to the components and/or to receive information from the components. Though only a portion of the vehicle 100 and hence a portion of the electronic (or electronically-controlled) components within the vehicle 100 are shown in FIG. 1, it is understood that the CEU 114 may be in electrical communication with some or all of the electronic (or electronically-controlled) components within the vehicle from the location shown.

The CEU 114 can include one or more control units (not shown) each having a memory and a processor that is operable to execute instructions that are stored in the memory in order to perform operations. The one or more control units within the CEU 114 can be associated with individual components distributed throughout the vehicle 100 or groups of components, such as the suspension components 106, the steering components 108, and the braking components 110. The CEU 114 is responsible for implementing vehicle responses based, for example, on decision-making algorithms in an autonomous system and/or on driver inputs to the vehicle 100.

For example, the CEU 114 can receive information from sensors associated with the wheels 104, the suspension components 106, and/or the steering components 108. The CEU 114 can make decisions regarding operation of the wheels 104, the suspension components 106, and/or the steering components 108 based on the information received. For example, the information from the sensors can include representations of the roadway on which the vehicle 100 is traveling including objects and obstacles on the roadway. This information may identify terrain type, lane and roadway boundaries, presence of weather conditions (such as wet pavement or snow) or may be usable to allow identification of terrain type, weather conditions, and roadway and lane boundaries. Decision making algorithms associated with the CEU 114 may include, for example, modifying operating characteristics of various components of the vehicle 100 based on the information received from the sensors.

As an example, if a terrain change or a wet surface is detected ahead of the vehicle 100, the relevant control unit within the CEU 114 may send a command to an actuator associated with the wheels 104 in order to change a pressure of the wheels 104 to reduce wheel slip associated with the changed terrain or wet surface. Another control unit within the CEU 114 may send a command to an actuator within the suspension components 106 in order to change performance and/or properties of one or more of the suspension components 106 to better provide comfort to passengers while the vehicle 100 traverses a changed terrain or a wet surface. Another control unit within the CEU 114 may send a command to an actuator within the steering components 108 to generate haptic feedback (e.g., via a steering wheel nudge, a vibration, or a pattern of vibrations and nudges) to alert a driver of an upcoming change in terrain or a wet surface.

FIG. 1 indicates a section A-A which extends through a portion of the propulsion components 112 and a portion of the CEU 114. FIG. 1 also indicates a section B-B that extends through a portion of the body structure 102 and an optional portion of the CEU 114 (shown in dashed lines). The CEU 114 is shown as having three portions to indicate various locations and configurations for implementation of the CEU 114, though additional or fewer portions of the CEU 114 and additional or fewer locations for implementation are also possible. Packaging details related to the CEU 114 with respect to other components within the vehicle 100 are described in respect to FIGS. 2 and 3.

Figure 2:
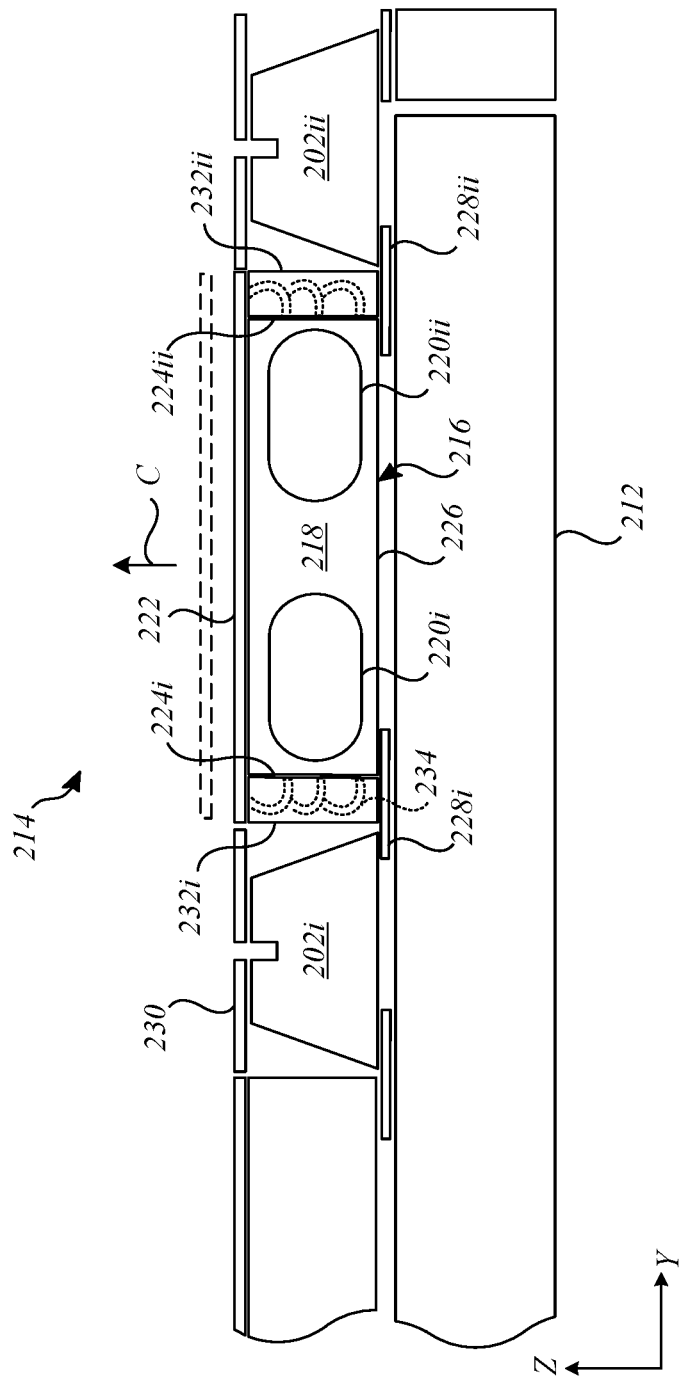
FIG. 2 is a schematic sectional view through section A-A of FIG. 1.

FIG. 2 is a schematic sectional view through section A-A of FIG. 1. The view is truncated in the Y direction, showing a cross-section of a CEU 214 for the vehicle 100, though it is understood that additional CEUs can be present and implemented in a similar way. The CEU 214 includes a housing 216 defining a cavity 218. Control units 220$i$, 220$ii$ are disposed within the cavity 218. A cover 222 is configured to removably couple to the housing 216 and to enclose the control units 220$i$, 220$ii$ within the cavity 218. Removability of the cover 222 is shown using dashed lines and the arrow C extending in the Z direction. That is, the cover 222 can be lifted away from the remainder of the housing 216 in order to access the control units 220i, 220ii in the cavity 218. The term "cover" is used to indicate a structural component that is configured to partially or fully enclose the cavity 218 by forming an exterior of the housing 216.

The housing 216 can be formed by side walls 224i, 224ii that extend in the Z direction and a bottom wall 226 that extends between the side walls 224i, 224ii in the Y direction. The cavity 218 that supports the control units 220i, 220ii is disposed within these walls 224i, 224ii, 226. The housing 216 is mountable in the vehicle 100 between seat rails 202i, 202ii. The seat rails 202i, 202ii can be structures similar to the body structure 102 described in respect to FIG. 1. The seat rails 202i, 202ii can be configured to support a seat (not shown) in a vehicle cabin (not shown) of the vehicle 100. The seat rails 202i, 202ii can be structurally reinforced, such as including ribs or other strengthening mechanisms sufficient to prevent damage to the CEU 214, for example, during a vehicle event such as a side impact, by protecting the side walls 224i, 224ii of the housing 216.

The housing 216 is mountable both between the seat rails 202i, 202ii and above or otherwise adjacent to a thermally-conditioned subsystem of the vehicle, such as a propulsion component 212. The propulsion component 212 can be similar to the propulsion component 112 of FIG. 1, such as including a battery or batteries and an electric motor that utilizes electrical energy that is stored in the battery or batteries or is supplied by a generator. The propulsion component 212 can be thermally conditioned using a thermal control system (not shown), such as a thermal loop using heat exchangers configured to control a temperature of the propulsion component 212. The thermal control system that controls a temperature of the propulsion component 212 can indirectly thermally condition the control units 220i, 220ii in the housing 216 based on proximity of the housing 216 and the propulsion component 212.

For example, the bottom wall 226 of the housing 216 can be mounted to the propulsion component 212 and/or the seat rails 202i, 202ii, such as using mounting brackets 228i, 228ii. The mounting brackets 228i, 228ii can be formed from or coupled to the seat rails 202i, 202ii. In another example, the bottom wall 224 of the housing 216 can form a portion of a housing surrounding the propulsion component 212, that is, the housing of the propulsion component 212 can serve as the bottom wall 226 of the housing 216 for the CEU 214. In these examples, the thermally-conditioned subsystem, that is, the propulsion component 212, indirectly thermally conditions the control units 220i, 220ii via convection and/or conduction based on proximity of the bottom wall 226 and the propulsion component 212. In this example, the CEU 214 does not need separate heating or cooling features since a temperature of the control units 220i, 220ii is moderated by temperature control of the propulsion component 212. For example, the control units 220i, 220ii may operate with power levels between five and fifteen Watts. The thermal control system that conditions the propulsion component 212 may be configured to thermally condition components that operate with power levels between fifty and one hundred and fifty Watts such that heating or cooling the control units 220i, 220ii occurs by convection or conduction based on the small distance between the control units 220i, 220ii and the propulsion component 212.

When the cover 222 is secured over the cavity 218 that includes the control units 220i, 220ii, the cover 222 may become or be contiguous with a portion of an interior surface 230 of a vehicle cabin of the vehicle 100. The cover 222 may also be located adjacent to or support the interior surface 230 of the vehicle cabin. The interior surface 230 in the example shown in FIG. 2 is a floor of the vehicle cabin. In other words, both the seat rails 202i, 202ii and the housing 216 are hidden beneath the interior surface 230 when the cover 222 is aligned with a remainder of the interior surface 230 in a closed or installed position. The cover 222 can include a reinforced component to provide support and, for example, include or be present beneath carpeting or trim that covers a remainder of the interior surface 230. By using open space between the seat rails 202i, 202ii to mount the housing 216 of the CEU 214, a volume of the vehicle cabin does not need to be reduced to package the CEU 214. The control units 220i, 220ii are also more easily accessible for maintenance when stored in a central location such as between the seat rails 202i, 202ii and above the propulsion component 212 as shown.

The control units 220i, 220ii are configured for electronic communication with feature units (not shown) disposed throughout the vehicle. Though two control units 220i, 220ii are shown, additional control units (not shown) can be located within the CEU 214. The term "feature units" is used to describe electronic or electro-mechanical system components spread or distributed in various locations throughout the vehicle 100 that include controllable features, such as the wheels 104, the suspension components 106, the steering components 108, the braking components 110, and the propulsion components 112, 212 described in FIGS. 1 and 2 as well as other components that are not shown such as audio components, ventilation components, or lighting components. By locating the control units 220i, 220ii within the CEU 214, individual housings and mounting mechanisms for the control units 220i, 220ii can be eliminated, reducing a weight of the vehicle 100. By locating the CEU 214 in a central position within the vehicle cabin, such as between the seat rails 202i, 202ii, a length of wiring harnesses can be reduced, further reducing a weight of the vehicle 100. The wiring harnesses (not shown) that couple the CEU 214 and the feature units need only be long enough to reach either forward or backward between the CEU 214 and the feature units (not shown) at forward or rearward locations within the vehicle 100 given the central location of the CEU 214.

In some examples, the control units 220i, 220ii can be removable and replaceable with other control units (not shown) when the cover 222 is removed from the housing 216 and the cavity 218 is accessible to a technician from a location within the vehicle cabin. In the example of FIG. 2, a seat (not shown) that is supported by the seat rails 202i, 202ii can be repositionable such that the cover 222 is removable, openable, and/or replaceable to support such maintenance access to the control units 220i, 220ii. The seat can be translatable, rotatable, or otherwise moveable to a predetermined position to allow access to and repositioning of the cover 222. The CEU 214 can include adequate space to integrate more control units (not shown) to add features to or subtract features from the vehicle 100. For example, a feature level of the vehicle 100 can be associated with installation of a predetermined number and type of feature units and a predetermined number and type of control units, such as including the control units 220i, 220ii, where different feature levels for the vehicle 100 have different numbers and types of feature units and control units installed.

To support communication between the control units 220i, 220ii within the CEU 214 and the feature units (not shown) distributed through the vehicle, the CEU 214 may include one or more adapters 232*i*, 232*ii*. The adapters 232*i*, 232*ii* can include various types or styles of connectors 234 (e.g., quick-mate, blind-mate, flexible printed circuit, or other type, shown in dotted line) that enable power and/or data communications between the control units 220*i*, 220*ii* within the cavity 218 and the feature units spread throughout the vehicle 100. The use of adapters 232*i*, 232*ii* with standardized types of connectors 234 allows for ease of upgrade and replacement for either or both of the feature units and the control units 220*i*, 220*ii* while maintaining a common communication interface between the CEU 214 and the feature units. For example, the control unit 220*i* can be replaced when a feature unit (not shown) in the vehicle 100 is upgraded without impacting the adapter 232*i* or requiring a change to a wiring harness (not shown) within the vehicle 100. The CEU 214 can be executed without the adapters 232*i*, 232*ii*, for example, using cables, wiring harnesses, and/or connectors that route within the housing 216 proximate to the control units 220*i*, 220*ii* (not shown).

In some examples, the side walls 224*i*, 224*ii* of the housing 216 may be absent, may be outboard of the adapters 232*i*, 232*ii*, or may be replaced with sides of the seat rails 202*i*, 202*ii* (not shown). When sides of the seat rails 202*i*, 202*ii* serve as side walls of the housing 216, the cavity 218 that stores the control units 220*i*, 220*ii* is formed between the seat rails 202*i*, 202*ii* and above the bottom wall 226. Even without the side walls 224*i*, 224*ii*, the cavity 218 would remain dry given its location in the vehicle 100. The cavity 218 and the control units 220*i*, 220*ii* would be protected from impact by the seat rails 202*i*, 202*ii* (and the propulsion component 212). In this example, the cover 222 can be configured to enclose the cavity 218, for example, by abutting or covering the seat rails 202*i*, 202*ii* (not shown).

The cover 222, the side walls 224*i*, 224*ii*, and the bottom wall 226 may be formed from corrugated or otherwise reinforced materials in order to support a floor of the vehicle 100 and protect the control units 220*i*, 220*ii* within the cavity 218 from damage. For example, various components or portions of the cover 222, the side walls 224*i*, 224*ii*, and the bottom wall 226 of the housing 216 may be formed from die-cast aluminum or composite materials or may include flanges, domed-shaping, ribs, ridges, or other strengthening features (not shown). The cover 222 may also include or be disposed under non-structural materials such as trim or carpeting that is included with a remainder of the interior surface 230. The centrally-located CEU 214 of FIG. 2 can be implemented with or replaced by CEU 314 described in respect to FIG. 3.

Figure 3:
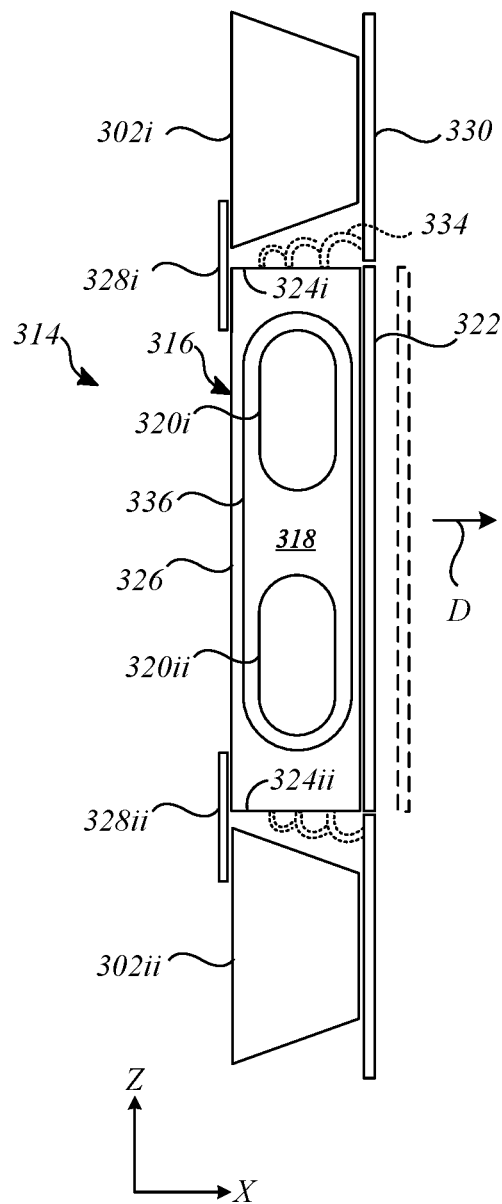
FIG. 3 is a schematic sectional view through section B-B of FIG. 1.

FIG. 3 is a schematic sectional view through section B-B of FIG. 1. The view is oriented in the Z direction, showing a cross-section of the CEU 314 for the vehicle 100. The CEU 314 includes a housing 316 defining a cavity 318. Control units 320*i*, 320*ii* are disposed within the cavity 318. A cover 322 is configured to removably couple to the housing 316 and to enclose the control units 320*i*, 320*ii* within the cavity 318. Removability of the cover 322 is shown using dashed lines and the arrow D extending in the X direction. That is, the cover 322 can be lifted away from the remainder of the housing 316 in order to access the control units 320*i*, 320*ii* in the cavity 318.

The housing 316 can be formed by side walls 324*i*, 324*ii* that extend in the X direction and a bottom wall 326 that extends between the side walls 324*i*, 324*ii* in the Z direction. The cavity 318 that holds the control units 320*i*, 320*ii* is disposed within these walls 324*i*, 324*ii*, 326. The housing 316 is mountable in the vehicle 100 between, that is, above and below, cross-cabin rails 302*i*, 302*ii*. For example, the bottom wall 326 of the housing 316 can be mounted to the cross-cabin rails 302*i*, 302*ii* using mounting brackets 328*i*, 328*ii*. The mounting brackets 328*i*, 328*ii* can be formed from or coupled to the cross-cabin rails 302*i*, 302*ii*. Other mounting schemes are possible.

The cross-cabin rails 302*i*, 302*ii* can be structures similar to the body structure 102 described in respect to FIG. 1 and the seat rails 202*i*, 202*ii* described in respect to FIG. 2. The cross-cabin rails 302*i*, 302*ii* can be configured to support an interior surface 330 in a vehicle cabin (not shown) of the vehicle 100. The cross-cabin rails 302*i*, 302*ii* can also be configured to support a windshield or a backlight (not shown) of the vehicle 100. The cross-cabin rails 302*i*, 302*ii* can be structurally reinforced, such as including ribs or other strengthening mechanisms sufficient to prevent damage to the CEU 314, for example, during a vehicle event such as a rollover or a side impact, by protecting the side walls 324*i*, 324*ii* of the housing 316.

The CEU 314 can include a thermal control system 336 to control a temperature of the control units 320*i*, 320*ii*. The thermal control system 336 can be configured to thermally condition the control units 320*i*, 320*ii* within the cavity 318 using a fluid circulating in a thermal loop and one or more heat exchangers (not shown). The thermal control system 336 can be disposed at least partially within the housing 316. By consolidating the control units 320*i*, 320*ii* that need to be heated or cooled in one location within the CEU 314, a reduced amount of glycol, coolant, or other fluid used for thermal transfer can be routed throughout the vehicle 100.

When the cover 322 is secured over the cavity 318 that includes the control units 320*i*, 320*ii*, the cover 322 may become or be contiguous with a portion of the interior surface 330 of a vehicle cabin of the vehicle 100. The cover 322 may be located beneath or include trim features that blend with the interior surface 330. The interior surface 330 in the example shown in FIG. 3 serves as a dash panel (front wall) or a rear wall of the vehicle cabin. In other words, both the cross-cabin rails 302*i*, 302*ii* and the housing 316 are hidden behind the interior surface 330 when the cover 322 is aligned with a remainder of the interior surface 330 in a closed or installed position. By using open space between the cross-cabin rails 302*i*, 302*ii* to mount the housing 316 of the CEU 314, a volume of the vehicle cabin does not need to be reduced to package the CEU 314. The control units 320*i*, 320*ii* are also more easily accessible for maintenance when stored in a central location such as between the cross-cabin rails 302*i*, 302*ii*.

The control units 320*i*, 320*ii* are configured for electronic communication with feature units (not shown) disposed throughout the vehicle in a manner similar to the control units 220*i*, 220*ii* of FIG. 2. By locating the CEU 314 between cross-cabin rails 302*i*, 302*ii* adjacent to the vehicle cabin, wiring harness length can be reduced for feature units located at an end of the vehicle 100 that includes the cross-cabin rails 302*i*, 302*ii*. A second CEU (not shown) can be packaged at an opposite end of the vehicle 100 to avoid running wiring harnesses a length of the vehicle cabin to reduce a weight of the vehicle 100.

The control units 320*i*, 320*ii* can be removable and replaceable with other control units (not shown) when the cover 322 is removed from the housing 316 and the cavity 318 is accessible to a technician from a location within the vehicle cabin. In the example of FIG. 3, a seat or a work surface (not shown) may be located proximate to the interior surface 330. The seat or the work table can be repositionable such that the cover 322 is removable, openable, and/or replaceable to support such maintenance access to the control units 320*i*, 320*ii*. The CEU 314 can include adequate space to integrate more control units (not shown) to add features to or subtract features from the vehicle 100.

To support communication between the control units 320*i*, 320*ii* within the CEU 314 and the feature units (not shown) distributed through the vehicle, the CEU 314 may include various types or styles of connectors 334 (e.g., quick-mate, blind-mate, flexible printed circuit, or other type, shown in dotted line) that enable power and/or data communications between the control units 320*i*, 320*ii* within the cavity 318 and the feature units spread throughout the vehicle 100. The connectors 334 can couple to cables, wiring harnesses, and/or other connectors (not shown) that route both within and external to the housing 316 to support power and/or data communications between the control units 320*i*, 320*ii* and the feature units.

In some examples, the side walls 324*i*, 324*ii* of the housing 316 may be absent or replaced with sides of the cross-cabin rails 302*i*, 302*ii* (not shown). When sides of the cross-cabin rails 302*i*, 302*ii* serve as side walls of the housing 316, the cavity 318 that stores the control units 320*i*, 320*ii* is formed between the cross-cabin rails 302*i*, 302*ii* and to a right (in the X direction) of the bottom wall 326. Even without the side walls 324*i*, 324*ii*, the cavity 318 would remain dry given its location in behind the interior surface 330. The cavity 318 and the control units 320*i*, 320*ii* would be protected from front, rear, side, and overhead impacts by the cross-cabin rails 302*i*, 302*ii*. In this example, the cover 322 can be configured to enclose the cavity 318, for example, by abutting or covering the cross-cabin rails 302*i*, 302*ii* (not shown).

The cover 322, the side walls 324*i*, 324*ii*, and the bottom wall 326 may be formed from corrugated or otherwise reinforced materials in order to support a dash panel, a windshield, or a backlight of the vehicle 100 and protect the control units 320*i*, 320*ii* within the cavity 318 from damage. For example, various components or portions of the cover 322, the side walls 324*i*, 324*ii*, and the bottom wall 326 of the housing 316 may be formed from die-cast aluminum or composite materials or may include flanges, domed-shaping, ribs, ridges, or other strengthening features (not shown).

Figure 4:
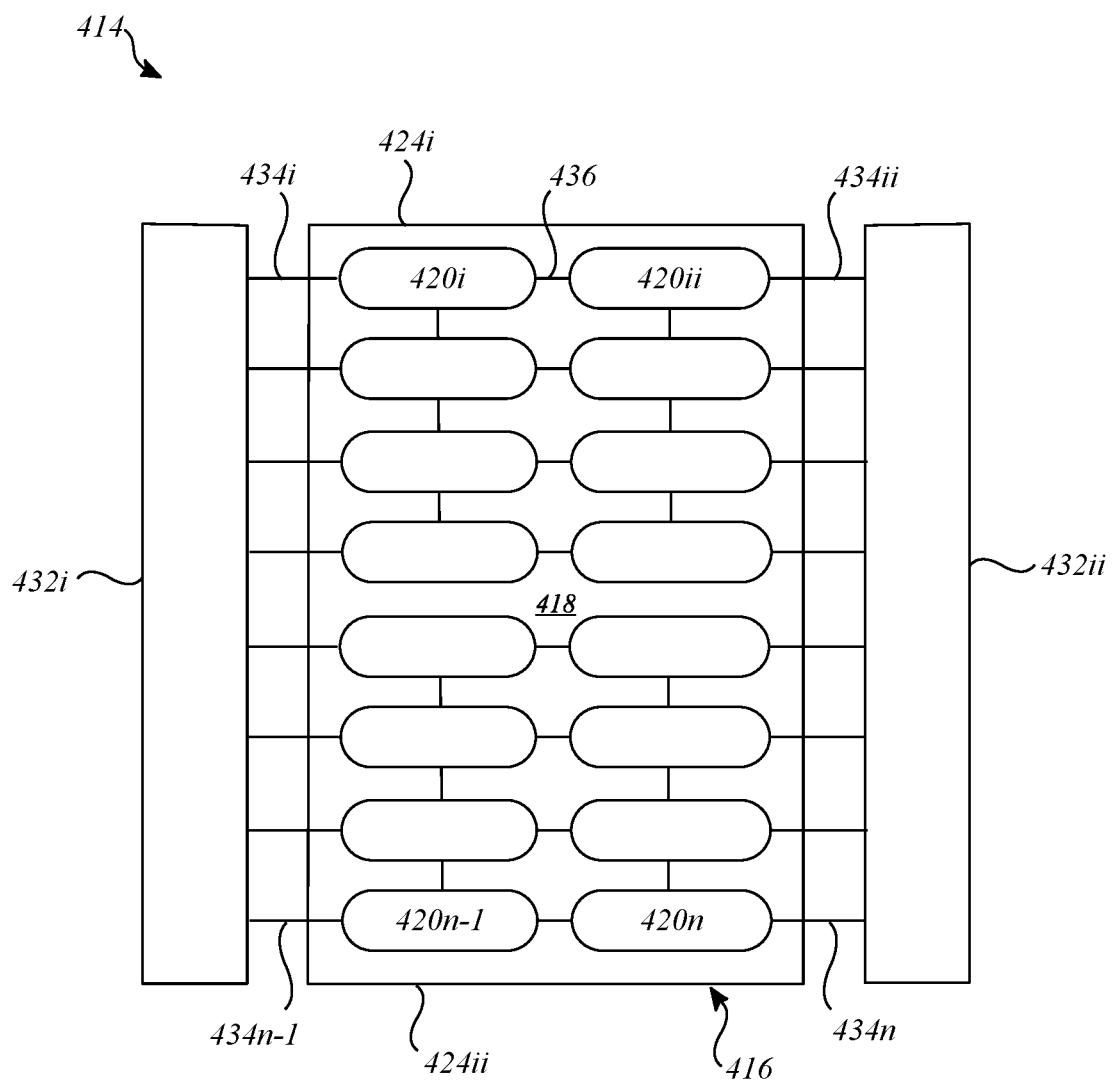
FIG. 4 is a schematic top view illustration of a consolidated electronics unit.

FIG. 4 is a schematic top view illustration of a CEU 414. The CEU 414 can be implemented in place of any of the CEUs 114, 214, 314 of FIGS. 1-3 in various positions within the vehicle 100. The CEU 414 includes a housing 416 defining a cavity 418. Multiple control units 420*i*, 420*ii*, 420*n*-1, 420*n* are shown as evenly spaced within a cavity 418, for example, held in position using slotted walls, trays, or other mounting means (not shown) that allow the control units 420*i*, 420*ii*, 420*n*-1, 420*n* to be removed and replaced, for example, to support maintenance or feature upgrades within the vehicle 100. The cavity 418 is defined between side walls 424*i*, 424*ii*, only two of which are labeled. A cover (not shown) can enclose the control units 420*i*, 420*ii*, 420*n*-1, 420*n* within the cavity 418.

The control units 420*i*, 420*ii*, 420*n*-1, 420*n* are in electronic communication with adapters 432*i*, 432*ii* through use of connectors 434*i*, 434*ii*, 434*n*-1, 434*n*. The connectors 434*i*, 434*ii*, 434*n*-1, 434*n* can take various forms, such as quick-mate, blind-mate, flexible printed circuit, or other type to enable power and/or data communications between the control units 420*i*, 420*ii*, 420*n*-1, 420*n* within the cavity 418 and the adapters 432*i*, 432*ii* that are adjacent to the housing 416 of the CEU 414 in the example of FIG. 4. In other examples (not shown), the adapters 432*i*, 432*ii* may be absent or may serve as side walls for the housing 416. In an example without the adapters 432*i*, 432*ii*, the connectors 434*i*, 434*ii*, 434*n*-1, 434*n* can route through the housing 416 to couple with cables or wiring harnesses (not shown) to establish communication between the control units 420*i*, 420*ii*, 420*n*-1, 420*n* and the feature units (not shown).

When present as shown in FIG. 4, the adapters 432*i*, 432*ii* support communication between the control units 420*i*, 420*ii*, 420*n*-1, 420*n* and various feature units (not shown) spread throughout the vehicle 100. In other words, the adapters 432*i*, 432*ii* serve as a common communication interface between the CEU 414 and the feature units. Using a common interface, any of the relevant control units 420*i*, 420*ii*, 420*n*-1, 420*n* can be easily replaced when a feature unit (not shown) in the vehicle 100 is upgraded without impacting the adapters 432*i*, 432*ii* or requiring a change to one or more cables or wiring harnesses (not shown) within the vehicle 100. The control units 420*i*, 420*ii*, 420*n*-1, 420*n* are also shown as connected to each other, for example, using a bus 436 or other form of electronic architecture, to allow communication between the control units 420*i*, 420*ii*, 420*n*-1, 420*n* or to allow multiple control units 420*i*, 420*ii*, 420*n*-1, 420*n* to communicate with specific feature units (not shown) through the adapters 432*i*, 432*ii*.

Figure 5:
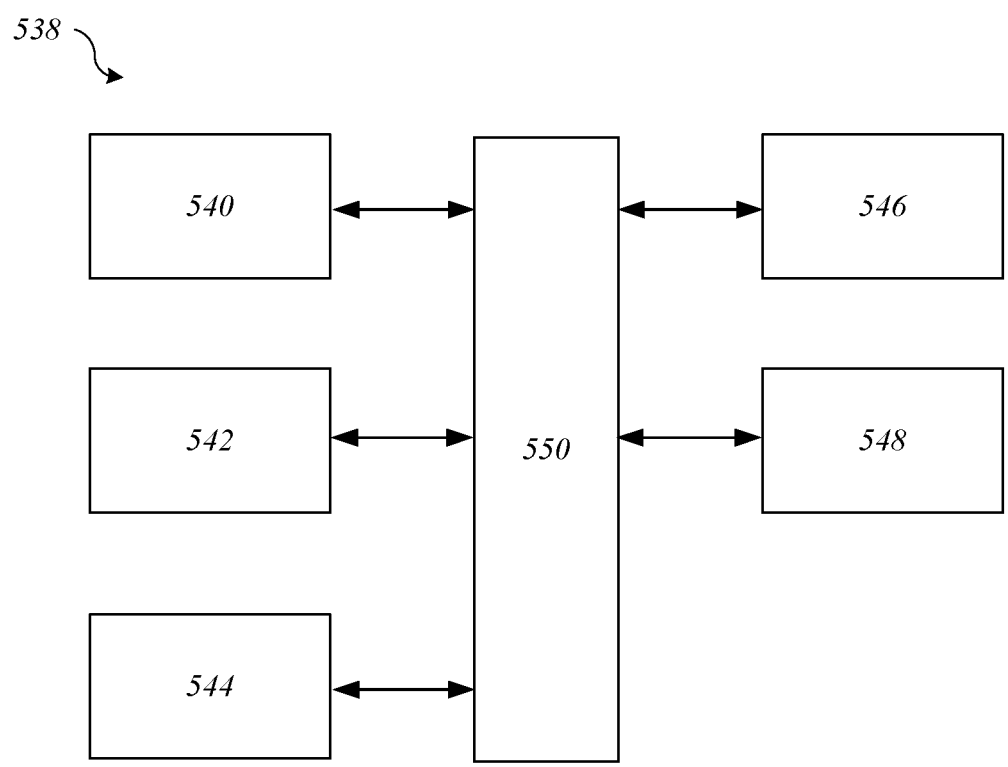
FIG. 5 is an illustration of a hardware configuration for a controller.

FIG. 5 shows an example of a hardware configuration for a controller 538 that may be used with the CEUs 114, 214, 314, 414 and/or other electronic components of the vehicle 100. In the illustrated example, the controller 538 includes a processor 540, a memory device 542, a storage device 544, one or more input devices 546, and one or more output devices 548. These components may be interconnected by hardware such as a bus 550 that allows communication between the components.

The processor 540 may be a conventional device such as a central processing unit and is operable to execute computer program instructions and perform operations described by the computer program instructions. The memory device 542 may be a volatile, high-speed, short-term information storage device such as a random-access memory module. The storage device 544 may be a non-volatile information storage device such as a hard drive or a solid-state drive.

The input devices 546 may include sensors and/or any type of human-machine interface, such as buttons, switches, a keyboard, a mouse, a touchscreen input device, a gestural input device, or an audio input device. The output devices 548 may include any type of device operable to send commands associated with an operating mode or state or provide an indication to a user regarding an operating mode, state, or configuration, such as a display screen or another interface for a CEU such as the CEUs 114, 214, 314, 414, or an audio output.

As described above, one aspect of the present technology is the gathering and use of data available from various sources, such as from sensors or user profiles, to improve the function of systems such as the CEUs 114, 214, 314, 414. The present disclosure contemplates that in some instances, this gathered data may include personal information data that uniquely identifies or can be used to contact or locate a specific person. Such personal information data can include demographic data, location-based data, telephone numbers, email addresses, twitter IDs, home addresses, data or records relating to a user's health or level of fitness (e.g., vital signs measurements, medication information, and exercise information), date of birth, or any other identifying or personal information.

The present disclosure recognizes that the use of personal information data, in the present technology, can be used to the benefit of users. For example, the personal information data can be used to deliver changes to operational modes or configurations of systems such as the CEUs 114, 214, 314, 414 to best match user preferences or profiles. Other uses for personal information data that benefit the user are also possible. For instance, health and fitness data may be used to provide insights into a user's general wellness or may be used as positive feedback to individuals using technology to pursue wellness goals.

The present disclosure contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure. Such policies should be easily accessible by users and should be updated as the collection and/or use of data changes. Personal information from users should be collected for legitimate and reasonable uses of the entity and not shared or sold outside of those legitimate uses. Further, such collection/sharing should occur after receiving the informed consent of the users.

Additionally, such entities should consider taking any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices. In addition, policies and practices should be adapted for the particular types of personal information data being collected and/or accessed and adapted to applicable laws and standards, including jurisdiction-specific considerations. For instance, in the US, collection of or access to certain health data may be governed by federal and/or state laws, such as the Health Insurance Portability and Accountability Act (HIPAA); whereas health data in other countries may be subject to other regulations and policies and should be handled accordingly. Hence different privacy practices should be maintained for different personal data types in each country.

Despite the foregoing, the present disclosure also contemplates embodiments in which users selectively block the use of, or access to, personal information data. That is, the present disclosure contemplates that hardware and/or software elements can be provided to prevent or block access to such personal information data. For example, in the case of centrally-implemented CEUs, the present technology can be configured to allow users to select to "opt in" or "opt out" of participation in the collection of personal information data during registration for services or anytime thereafter. In addition to providing "opt in" and "opt out" options, the present disclosure contemplates providing notifications relating to the access or use of personal information. For instance, a user may be notified upon downloading an app that their personal information data will be accessed and then reminded again just before personal information data is accessed by the app.

Moreover, it is the intent of the present disclosure that personal information data should be managed and handled in a way to minimize risks of unintentional or unauthorized access or use. Risk can be minimized by limiting the collection of data and deleting data once it is no longer needed. In addition, and when applicable, including in certain health related applications, data de-identification can be used to protect a user's privacy. De-identification may be facilitated, when appropriate, by removing specific identifiers (e.g., date of birth, etc.), controlling the amount or specificity of data stored (e.g., collecting location data a city level rather than at an address level), controlling how data is stored (e.g., aggregating data across users), and/or other methods.

Therefore, although the present disclosure broadly covers use of personal information data to implement one or more various disclosed embodiments, the present disclosure also contemplates that the various embodiments can be implemented without the need for accessing such personal information data. That is, the various embodiments of the present technology are not rendered inoperable due to the lack of all or a portion of such personal information data. For example, changes in operational modes or configurations associated with a CEU can be implemented for a given user by inferring user preferences or user status based on non-personal information data, a bare minimum amount of personal information, other non-personal information available to the systems, or publicly available information.

What is claimed is:

1. A consolidated electronics unit for a vehicle, comprising:
  a housing defining a cavity and mountable in the vehicle adjacent to a thermally-conditioned component of the vehicle;
  control units disposed within the cavity, the control units configured for electronic communication with feature units disposed throughout the vehicle; and
  a cover configured to:
    removably couple to the housing;
    enclose the control units within the cavity; and
    form a portion of an interior surface of a vehicle cabin of the vehicle,
  wherein the thermally-conditioned component is configured to indirectly thermally condition the control units in the housing based on proximity of the housing and the thermally-conditioned component.

2. The consolidated electronics unit of claim 1, wherein the control units are removable and replaceable with other control units when the cover is removed from the housing and the cavity is accessible from the vehicle cabin.

3. The consolidated electronics unit of claim 1, further comprising:
  an adapter including connectors that enable electronic communication between the control units within the cavity and the feature units disposed throughout the vehicle.

4. The consolidated electronics unit of claim 1, wherein the interior surface is a floor of the vehicle cabin.

5. The consolidated electronics unit of claim 4, wherein the housing is mountable in the vehicle between seat rails, and wherein the seat rails are configured to support a seat in the vehicle cabin and prevent damage to the consolidated electronics unit during a vehicle event.

6. The consolidated electronics unit of claim 1, further comprising:
  a thermal control system configured to directly thermally condition the control units within the housing using a fluid circulating in a thermal loop.

7. The consolidated electronics unit of claim 1, wherein the thermally-conditioned component is a propulsion component of the vehicle, wherein the propulsion component is thermally conditioned using a thermal control system, and wherein the thermal control system is configured to indirectly thermally condition the control units in the housing based on proximity of the housing and the propulsion component.

8. The consolidated electronics unit of claim 1, wherein the interior surface is a dash panel of the vehicle cabin.

9. The consolidated electronics unit of claim 8, wherein the housing is mountable in the vehicle between cross-cabin rails, and wherein the cross-cabin rails are configured to support a windshield or a backlight of the vehicle and prevent damage to the consolidated electronics unit during a vehicle event.

10. A housing for a consolidated electronics unit of a vehicle, the housing comprising:
   side walls disposed between seat rails, wherein the seat rails are configured to support a seat in a vehicle cabin of the vehicle;
   a bottom wall coupled to the side walls and mountable to a thermally-conditioned subsystem of the vehicle; and
   a cover removably coupleable to the side walls,
   wherein the cover, the side walls, and the bottom wall form a cavity configured to enclose control units,
   wherein the control units are configured for electronic communication with feature units disposed throughout the vehicle, and
   wherein the cover forms a portion of a floor of the vehicle cabin of the vehicle.

11. The housing of claim 10, wherein the control units are removable and replaceable with different control units when the cover is removed from the side walls.

12. The housing of claim 10, further comprising:
   an adapter including connectors that electronically couple the control units in the cavity and the feature units disposed throughout the vehicle.

13. The housing of claim 10, wherein the thermally-conditioned subsystem includes a propulsion component of the vehicle, and wherein the thermally-conditioned subsystem indirectly thermally conditions the control units via at least one of convection or conduction based on proximity of the bottom wall and the propulsion component.

14. A housing for a consolidated electronics unit of a vehicle, the housing comprising:
   side walls mountable to vehicle rails of the vehicle;
   a bottom wall coupled to the side walls;
   a cover removably coupleable to the side walls and configured to form a portion of an interior surface of a vehicle cabin of the vehicle, wherein the cover, the side walls, and the bottom wall form a cavity configured to enclose control units in electronic communication with feature units disposed throughout the vehicle; and
   a thermal control system disposed at least partially within the housing and configured to thermally condition the control units within the cavity.

15. The housing of claim 14, wherein the interior surface of the vehicle cabin is a dash panel, and wherein the vehicle rails are cross-cabin rails.

16. The housing of claim 14, wherein the interior surface of the vehicle cabin is a floor, and wherein the vehicle rails are seat rails configured to support a seat in the vehicle cabin.

17. The housing of claim 16, wherein the bottom wall of the housing is mountable to or forms a portion of a subsystem housing of a thermally-conditioned subsystem of the vehicle.

18. The housing of claim 17, wherein the thermally-conditioned subsystem includes a propulsion component.

19. The housing of claim 14, wherein the control units are removable and replaceable with different control units when the cover is removed from the side walls.

20. The housing of claim 18, wherein the thermally-conditioned subsystem that thermally conditions the propulsion component is configured to indirectly thermally condition the housing based on proximity of the propulsion component and the housing.

* * * * *